United States Patent
Inoue et al.

(10) Patent No.: US 7,482,570 B2
(45) Date of Patent: *Jan. 27, 2009

(54) SOLID-STATE IMAGING DEVICE

(75) Inventors: Ikuko Inoue, Kanagawa-ken (JP); Hirofumi Yamashita, Kanagawa-ken (JP); Hidetoshi Nozaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/826,927

(22) Filed: Jul. 19, 2007

(65) Prior Publication Data

US 2007/0262241 A1 Nov. 15, 2007

Related U.S. Application Data

(62) Division of application No. 10/287,707, filed on Nov. 5, 2002, now Pat. No. 7,262,396.

(30) Foreign Application Priority Data

Nov. 7, 2001 (JP) ............................ P2001-342290

(51) Int. Cl.
*H01L 21/00* (2006.01)
*H01L 27/00* (2006.01)
(52) U.S. Cl. ................ 250/208.1; 250/214.1; 257/443; 348/73
(58) Field of Classification Search ............... 250/208.1, 250/214.1; 348/294, 302, 308, 335, 340; 257/443; 438/73, 85
See application file for complete search history.

(56) References Cited

U.S. PATENT DOCUMENTS 6,211,509 B1 4/2001 Inoue et al.
6,215,165 B1 4/2001 Connolly et al.
6,403,998 B1 6/2002 Inoue (Continued)

FOREIGN PATENT DOCUMENTS

JP 61-137341 6/1986

(Continued)

OTHER PUBLICATIONS

Japanese Patent Office Action received in counterpart Japanese application No. 2001-342290 mailed on Aug. 6, 2004.

(Continued)

*Primary Examiner*—John R Lee
(74) *Attorney, Agent, or Firm*—Finnegan, Henderson, Farabow, Garrett & Dunner, L.L.P.

(57) ABSTRACT

The invention is regarding to solid-state imaging device. A solid-state imaging device consistent with the present invention includes, a plurality of unit cells on a semiconductor substrate of a first conductivity type, each unit cell including a photoelectric conversion unit comprising a photodiode having a diffusion layer of a second conductivity type and a signal scanning circuit unit; a trench isolation region for isolating the photoelectric conversion unit from the signal scanning circuit unit, the trench isolation region being formed in the semiconductor substrate;

a first element-isolating diffusion layer of the first conductivity type formed under a bottom face of the trench isolation region down to a position deeper than the diffusion layer of the photodiode from the surface of the semiconductor substrate.

22 Claims, 10 Drawing Sheets

U.S. PATENT DOCUMENTS

| | | | |
|---|---|---|---|
| 6,570,222 B2 | 5/2003 | Nozaki et al. | |
| 7,262,396 B2 * | 8/2007 | Inoue et al. | 250/208.1 |
| 2006/0219867 A1 | 10/2006 | Yamaguchi et al. | |
| 2007/0262240 A1 * | 11/2007 | Inoue et al. | 250/208.1 |
| 2007/0262241 A1 * | 11/2007 | Inoue et al. | 250/208.1 |

FOREIGN PATENT DOCUMENTS

| | | |
|---|---|---|
| JP | 2000-150848 | 5/2000 |
| JP | 2000-299453 | 10/2000 |

OTHER PUBLICATIONS

Ando Takaoji, Fundamentals Solid Imaging Elements—Electronic Eye Mechanisms, Nippon Rikou Publishing Company K.K., Dec. 10, 1999, First Ed. p. 138-139.

* cited by examiner

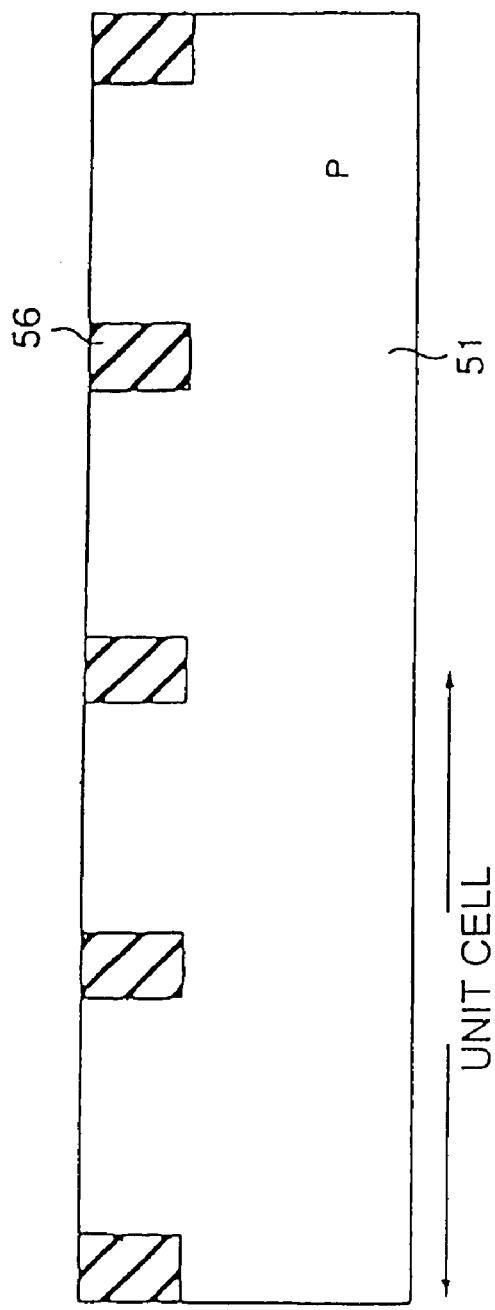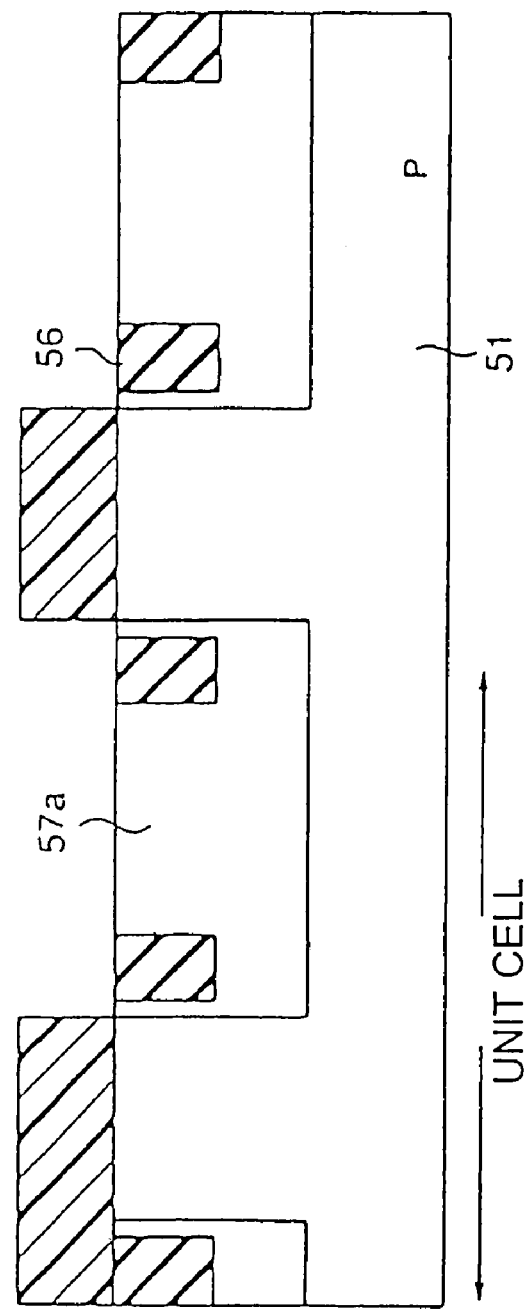
FIG. 8(a)
FIG. 8(b)

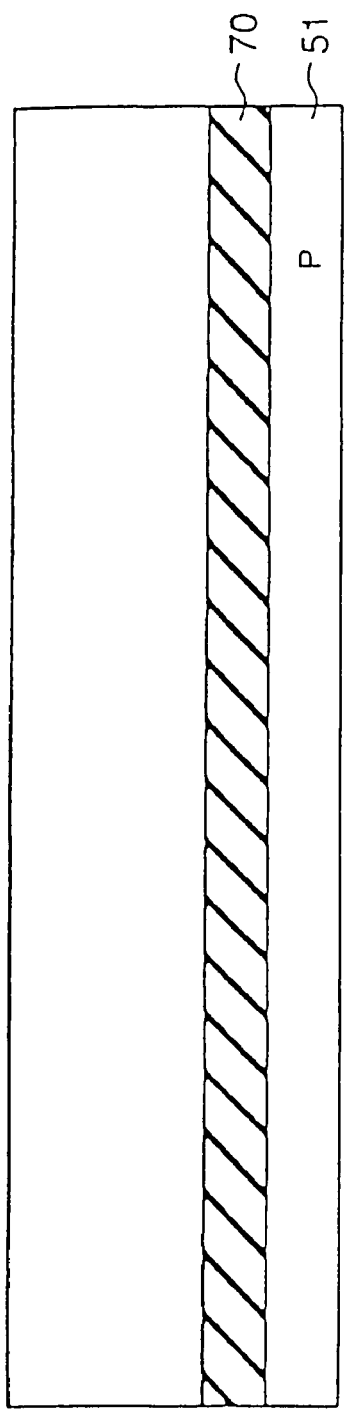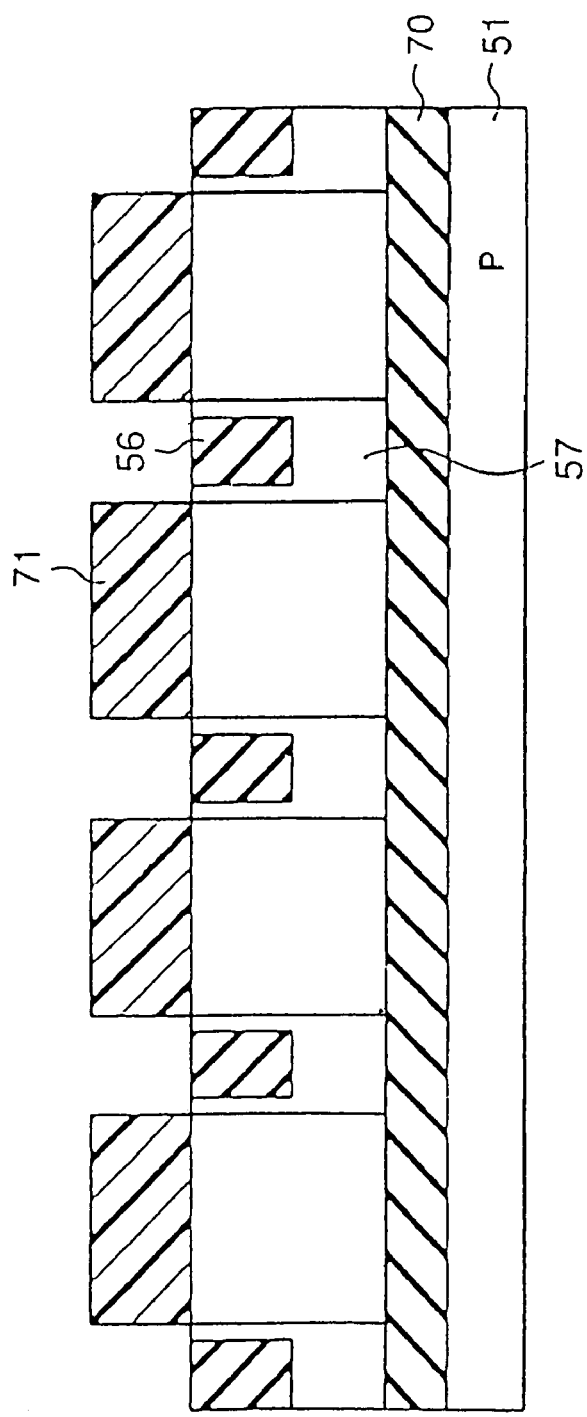

SOLID-STATE IMAGING DEVICE

CROSS REFERENCE RELATED APPLICATIONS

This is a divisional of U.S. patent application Ser. No. 10/287,707, filed Nov. 5, 2002, now U.S. Pat. No. 7,262,396 which is incorporated in its entirety by reference. This application is also based upon and claims priority from prior Japanese Patent Application P2001-342290 filed on Nov. 7, 2001, the entire contents of which are incorporated by reference herein.

FIELD OF THE INVENTION

The present invention relates to Metal Oxide Semiconductor (MOS) solid-state imaging devices. More specifically, the present invention relates to a MOS solid-state imaging device including a trench isolation structure, which is utilized for an image sensor used in, for example, a video camera or an electronic still camera, a line sensor used in a printer.

BACKGROUND

MOS solid-state imaging elements have advantages such as the ability to be driven by a single low-voltage power source and the ability to reduce design costs. Moreover, the fabrication process of MOS solid-state imaging element is similar to the fabrication process of MOS element. Therefore, it is possible to construct system LSI which includes various signal processing circuits (such as logic circuits) using MOS elements, and MOS solid-state imaging devices simultaneously mounted on one substrate.

Generally, a diffusion layer for a source or a drain of a MOS transistor to be used in a logic circuit tends to become shallower in response to requirements for reduction in film thickness and size along with scaling of a power-source voltage. When MOS transistors are miniaturized in a logic circuit, elements of MOS solid-state imaging device also need to be miniaturized.

Meanwhile, instead of conventional Local Oxidation of Silicon (LOCOS) isolation, trench isolation is used as an element isolation structure for MOS solid-state imaging device for the purpose of downsizing the circuit.

FIG. 1 schematically shows a cross-sectional structure of partial extraction (equivalent to an area including two unit cells adjacent in a horizontal direction) of the CMOS image sensor.

In the CMOS image sensor, a plurality of unit cells are formed on a p-type semiconductor substrate (normally a silicon substrate) 31, for example. Each unit cell includes a photoelectric conversion accumulator unit 32 and a scanning circuit unit, which are mutually isolated by a trench isolation region 36.

In the photoelectric conversion accumulator unit 32, a photodiode is formed from a pn junction of the p-type silicon substrate 31 and an n-type diffusion layer 37 formed on a surface thereof.

The scanning circuit unit includes an amplification transistor 33, a vertical address transistor 34 and a reset transistor 35 each of which is made of an NMOS transistor, a signal readout gate 38, an amplification gate 39, a vertical address gate 40, and a reset gate 41. Reference numeral 42 denotes a drain line; reference numeral 43 denotes a signal line; reference numeral 44 denotes a light-shielding film and a connecting line using aluminum, for example; reference numeral 45 denotes an interlayer film; and reference numeral 46 denotes a condenser lens. Illustration of a gate insulating film, a color filter and the like is omitted herein.

In the CMOS image sensor, incident light is subjected to photoelectric conversion inside the semiconductor substrate 31. Accordingly, if the photoelectric conversion accumulator unit 32 is made shallow to accommodate scaling, then performance is deteriorated in relation to the wavelength of the incident light. Therefore, in the CMOS image sensor including the deep diffusion layer 37 for the photodiode, adoption of a trench isolation structure equivalent to a structure for a logic circuit on the same chip incurs problems in inter-pixel isolation or color mixture.

Moreover, although the trench isolation structure can be downsized in comparison with conventional LOCOS isolation structure, it is well known that the trench isolation structure frequently causes defects and damages the semiconductor substrate in the vicinity of trenches because of large stress attributable to processes thereof. Such defects and damages incur an increase in leakage currents, thus causing white spots or dark noises in the CMOS image sensor.

As described above, in the conventional CMOS image sensor, there has been a problem of increased white spots and dark noise attributes to leakage currents caused by deterioration in performances of inter-pixel isolation and color mixture when the trench isolation structure similar to that for the logic circuit on the same chip is adopted.

SUMMARY

A solid-state imaging device in accordance with an embodiment of this present invention including: a plurality of unit cells on a semiconductor substrate of a first conductivity type, each unit cell including a photoelectric conversion unit comprising a photodiode having a diffusion layer of a second conductivity type and a signal scanning circuit unit; a trench isolation region for isolating the photoelectric conversion unit from the signal scanning circuit unit, the trench isolation region being formed in the semiconductor substrate; and a first element-isolating diffusion layer of the first conductivity type formed under a bottom face of the trench isolation region down to a position deeper than the diffusion layer of the photodiode from the surface of the semiconductor substrate.

A semiconductor device in accordance with an embodiment of this present invention including: a plurality of unit cells on a semiconductor substrate of a first conductivity type, each unit cell including a photoelectric conversion unit comprising a photodiode having a diffusion layer of a second conductivity type and a signal scanning circuit unit; a trench isolation region for isolating the photoelectric conversion unit from the signal scanning circuit unit, the trench isolation region being formed in the semiconductor substrate; a first element-isolating diffusion layer of the first conductivity type formed under a bottom face of the trench isolation region down to a position deeper than the diffusion layer of the photodiode from the surface of the semiconductor substrate; a logic circuit including a MOS transistor and a trench region on the semiconductor substrate.

Other features, and advantages of the present invention will become apparent from the following detailed description. It should be understood, however, that the detailed description and specific examples, while indicating embodiments of the invention, are given by way of illustration only, since various changes and modifications within the spirit and scope of the invention will become apparent to those skilled in the art from this detailed description. The scope of the invention is defined by the claims.

BRIEF DESCRIPTION OF THE DRAWINGS

The accompanying drawings, which are incorporated in and constitute a part of this specification, illustrate several embodiments and together with the description, serve to explain the principles of the invention. A more complete appreciation of the present invention and many of its attendant advantages will be readily obtained by reference to the following detailed description considered in connection with the accompanying drawings, in which:

FIGS. 8A and 8B are cross-sectional views showing a fabricating process of the CMOS image sensor of FIG. 5, FIGS. 10A and 10B are cross-sectional views showing a fabricating process of the CMOS image sensor of FIG. 9.

DETAILED DESCRIPTION OF THE EMBODIMENTS

The embodiments of the present invention will be described in detail with reference to the accompanying drawings.

Figure 1:
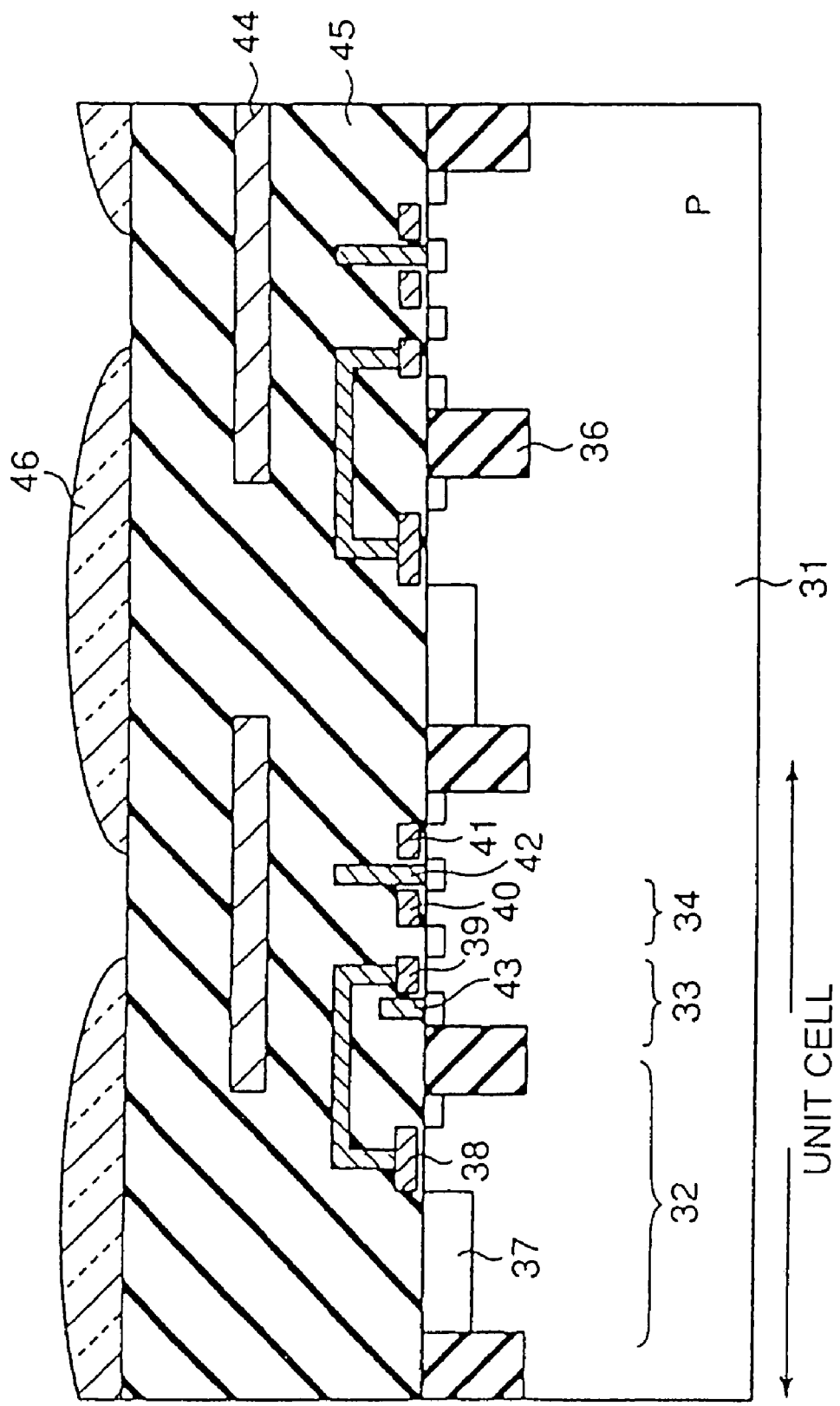
FIG. 1 is a schematic cross-sectional view of partial extraction of the CMOS image sensor.
Figure 2:
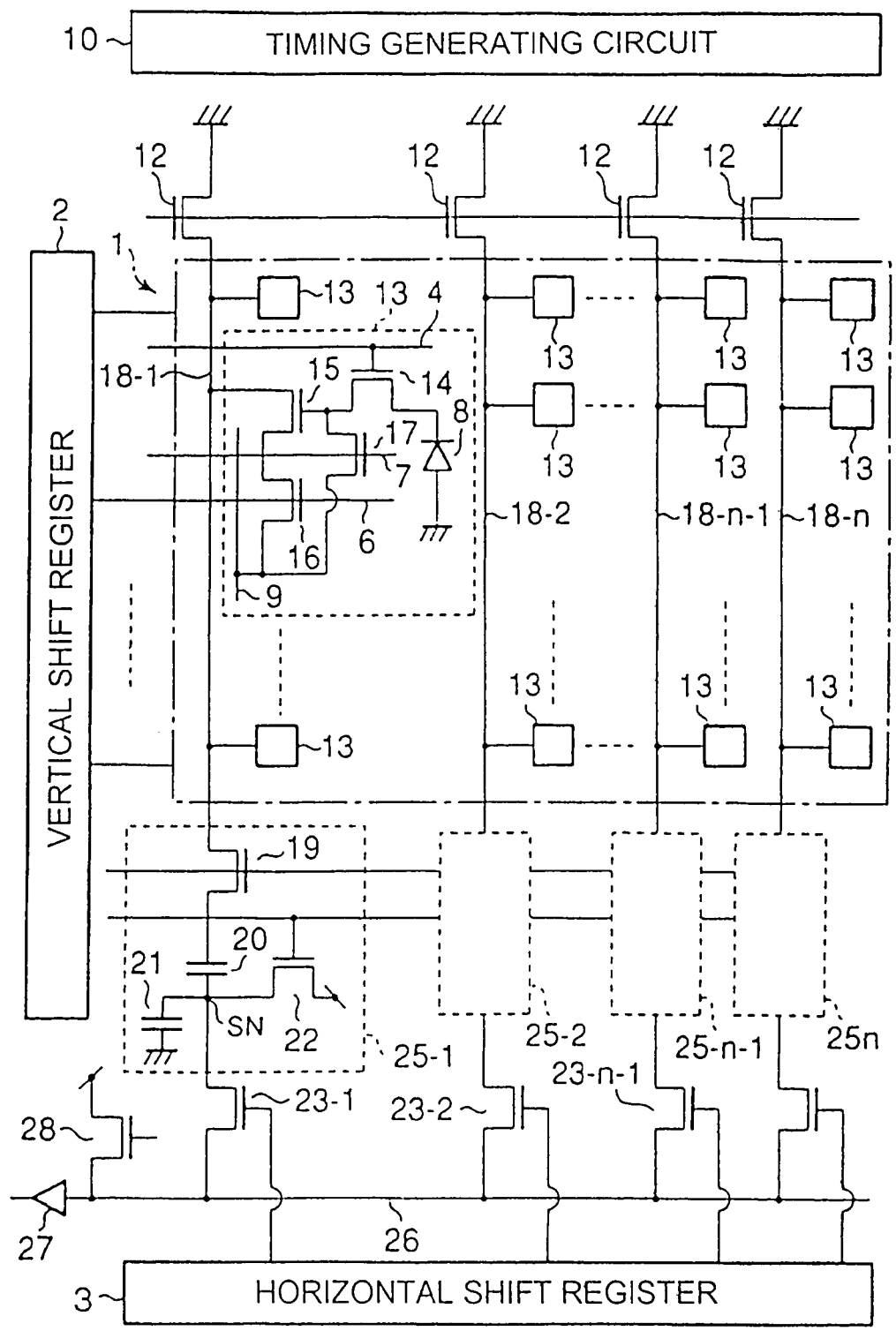
FIG. 2 is a circuit diagram of a conventional CMOS image sensor provided for each pixel with a readout circuit capable of reading a pixel signal.

FIG. 2 is a CMOS image sensor called an amplifier-type image sensor circuit, which is provided with a readout (charge-detecting) circuit capable of reading out a pixel signal for each pixel. Here, the illustration exemplifies a mode of disposing one photodiode in one unit cell.

In this CMOS image sensor, one-pixel-per-unit (single-pixel) unit cells 13 are formed on a cell region (an imaging region) 1 on a semiconductor substrate, arranged in a two-dimensional matrix. Each unit cell 13 includes a photodiode 8 in which ground potential is given to an anode side thereof, a readout transistor 14 having one end connected to a cathode side of the photodiode 8, an amplification transistor 15 having a gate is connected to the other end of the readout transistor 14, a vertical selection transistor 16 having one end connected to one end of the amplification transistor 15, and a reset transistor 17 having one end connected to a gate of the amplification transistor 15.

Moreover, in the cell region 1, formed are readout lines 4 severally connected in common to the gates of the readout transistors 14 of the unit cells on the same row, vertical select lines 6 severally connected in common to the gates of the vertical selection transistors 16 of the unit cells on the same row, reset lines 7 severally connected in common to the gates of the reset transistors 17 of the unit cells on the same row, vertical signal lines 18-$i$ ($i$=1 to n) connected in common to the other ends of the respective amplification transistors 15 of the unit cells on the same column, and power source lines 9 severally connected in common to the other ends of the respective reset transistors 17 and the other ends of the respective vertical selection transistors 16 of the unit cells on the same column.

In addition, outside the cell region 1, are a plurality of load transistors 12 each of which is connected between one end of the vertical signal line 18-$i$ and a grounded node, horizontal selection transistors 23-$i$ each of which having one end connected correspondently to the other end of the vertical signal line 18-$i$ via a noise canceller circuit 25-$i$, a horizontal signal line 26 connected in common to the other ends of the plurality of horizontal selection transistors 23-$i$, an output amplifier circuit 27 connected to the horizontal signal line 26, a horizontal reset transistor 28 connected to the horizontal signal line 26, a vertical shift register 2 for driving the vertical selection transistors 16 on the respective rows in a scanning manner by supplying select signals to the vertical select lines 6 on the respective rows in the cell region 1 in a scanning manner, a horizontal shift register 3 for driving the horizontal selection transistors 23-$i$ in a scanning manner, a timing generator circuit 10 for generating various timing signals, and the like.

Each of the noise canceller circuits 25-$i$ is composed of a sample-and-hold transistor 19 having one end connected to the other end of the vertical signal line 18-$i$, a coupling capacitor 20 of which one end is connected to the other end of the sample-and-hold transistor 19, a capacitor 21 for temporary storage of signal charges which is connected between the other end of the coupling capacitor 20 and a grounded node, and a transistor 22 for clamping electric potential which is connected to a connecting node of the capacitors 20 and 21. The one end of the horizontal selection transistor 23-$i$ is connected to the connecting node of the capacitors 20 and 21.

Note that each of the horizontal selection transistors 23-$i$ is an NMOS transistor in an embodiment consistent with the present invention including an active area (an SDG region) formed in a p-well, the p-well being selectively formed on a surface layer of the semiconductor substrate. Note that the p-well is connected to ground potential.

Next, description will be made regarding behavior of the solid-state image sensor of FIG. 2.

A signal charge generated by photoelectric conversion of incident light onto each photodiode 8 is first stored in the photodiode 8. Prior to reading the signal charge out, a reset signal at an "H" level is given to the reset line 7 for a certain period so as to set the reset transistor 17 to on-state, whereby gate potential of the amplification transistor 15 is reset to desired electric potential.

Simultaneously, when a select signal at an "H" level is given to the vertical select line (an address line) 6 in a scanning manner selected by the vertical shift register 2, the vertical selection transistor 16 to which the select signal is given by the vertical select line 6 is controlled to on-state and a voltage of the power source line 9 is supplied to the amplification transistor 15 via the vertical selection transistor 16. In this way, the amplification transistor 15, which is source-follower connected, outputs electric potential corresponding to the gate potential to the relevant vertical signal line 18-$i$.

However, unevenness of the gate potential exists among the amplification transistors 15 which are reset as described above. Accordingly, unevenness of reset potential also appears among the vertical signal lines 18-$i$ on drain sides thereof. Given this factor, the sample-and-hold transistor 19 is controlled to on-state simultaneously with the reset transistor 17 in order to reset unevenness of the reset potential among the vertical signal lines 18-$i$, whereby the reset potential of the vertical signal line 18-$i$ is transferred to the capacitor 21 via the capacitor 20. Thereafter, the transistor 22 for clamping electric potential is settled to on-state, whereby a voltage at the connecting node of the capacitors 20 and 21 is fixed uniformly.

Next, when the readout line 4 of a certain row is selected (is provided with a readout signal at an "H" level) and the readout transistor 14 is turned on, the charge stored in the photodiode 8 is transferred to the gate of the amplification transistor 15 via the readout transistor to change the gate potential thereof. The amplification transistor 15 outputs a voltage signal corresponding to an amount of change of the gate potential to the relevant vertical signal line 18-$i$.

As a consequence, the amount of change of the voltage signal on the vertical signal line 18-$i$ accompanied with the readout operation after resetting is transferred to the capacitor 21 via the capacitor 20. Accordingly, a noise mixed in a precedent side to the noise canceller circuit 25-I, for example cell region 1, the noise such as unevenness of the reset potential among the vertical signal lines 18-$i$ attributable to the cell region 1, is removed.

After completing a series of noise removing operations as described above, the sample-and-hold transistor 19 is settled to off-state and the vertical selection transistor 16 is also settled to off-state to set the unit cell 13 to an unselected state, whereby the cell region 1 and the respective noise canceller circuits 25-$i$ are electrically isolated.

Thereafter, the horizontal reset transistor 28 is controlled to on-state to reset electric potential on the horizontal signal line 26, and then the horizontal selection transistors 23-$i$ are controlled sequentially to on-state whereby voltages at the connecting nodes of the capacitors 20 and 21 (signal preservation nodes SN) are sequentially read out. The voltages are amplified by the output amplifier circuit 27 and then outputted.

Note that in accordance with the present invention, the above-described series of the noise removing operations are performed upon a readout operation on every horizontal line.

Figure 3:
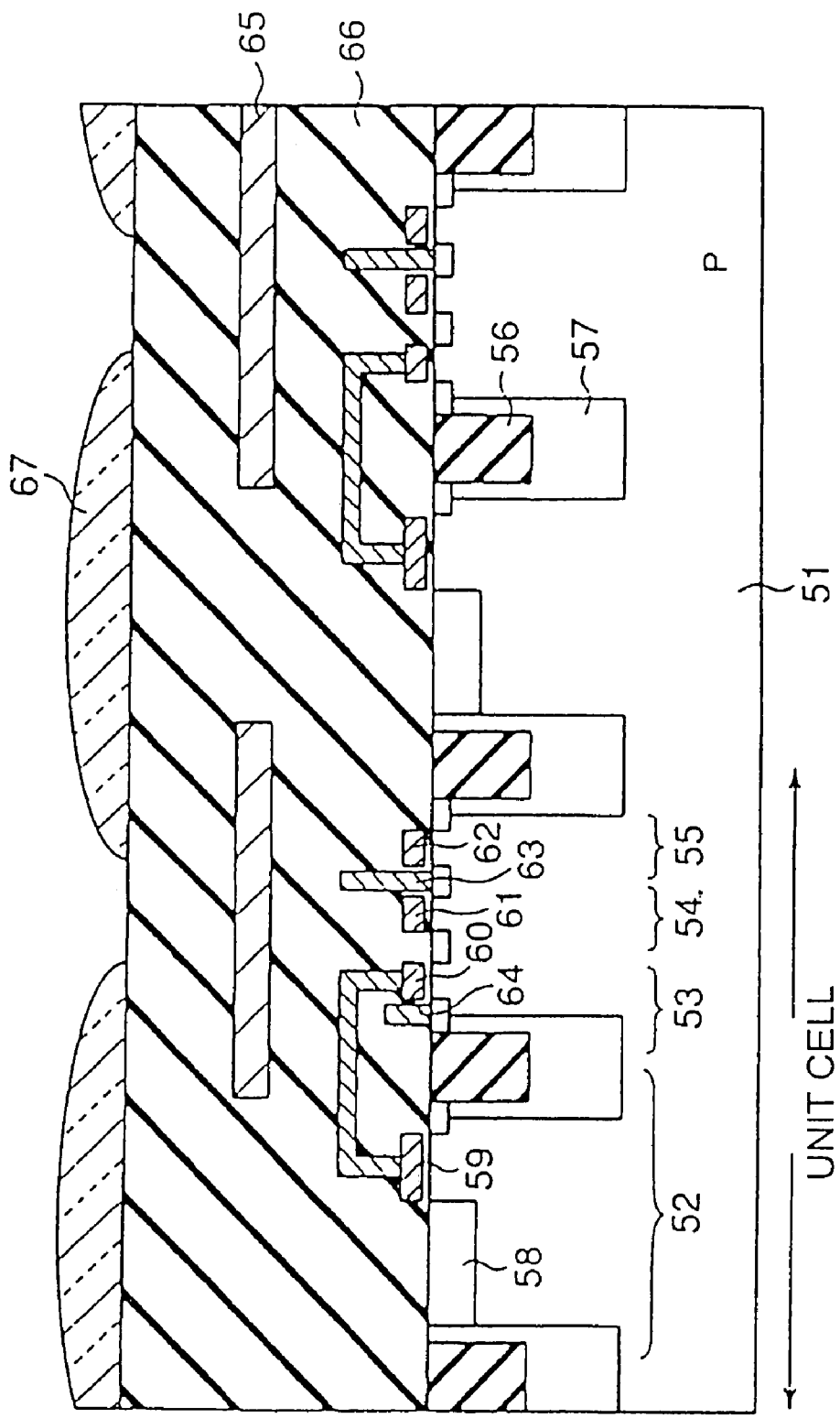
FIG. 3 is a circuit diagram showing a CMOS image sensor according to a first embodiment of the present invention.

FIG. 3 is a schematic of a cross-sectional structure of partial extraction (equivalent to an area including two unit cells adjacent in a horizontal direction) of a CMOS image sensor according to a first embodiment of the present invention.

As compared to the CMOS image sensor in the conventional example previously described with reference to FIG. 9, the CMOS image sensor of the embodiment has the same equivalent circuit but differs in formation of an element-isolating diffusion layer so as to cover a trench isolation region 56.

Specifically, in the CMOS image sensor of the embodiment, a plurality of unit cells are formed on a p-type semiconductor substrate (normally a silicon substrate) 51, for example. Each unit cell includes a photoelectric conversion accumulator unit (a photodiode) 52 and a scanning circuit unit, which are mutually isolated by the trench isolation region 56 formed by burying an insulator in a trench.

In the photoelectric conversion accumulator unit 52, a photodiode is formed by pn junction of the p-type silicon substrate 51 and an n-type diffusion layer 58 formed on a surface thereof.

The scanning circuit unit includes an amplification transistor 53, a vertical address transistor 54 and a reset transistor 55 each of which is made of an NMOS transistor, a signal readout gate 59, an amplification gate 60, a vertical address gate 61, and a reset gate 62. Reference numeral 63 denotes a drain line; reference numeral 64 denotes a signal line; reference numeral 65 denotes a light-shielding film and a connecting line using aluminum, for example; reference numeral 66 denotes an interlayer film; and reference numeral 67 denotes a condenser lens. Illustration of a gate insulating film, a color filter and the like is omitted herein.

Additionally, in the embodiment, a p-type first element-isolating diffusion layer 57 is formed so as to cover the trench isolation region 56. The element-isolating diffusion layer 57 is formed under a bottom face of the trench isolation region 56 down to a position deeper than the n-type diffusion layer 58 (so as to reach a position twice deeper than a depth of the n-type diffusion layer 58). In addition, the first element-isolating diffusion layer is also formed on sidewalls of the trench isolation-region 56.

As described above, the element-isolating diffusion layer 57, which is formed so as to cover the trench isolation region 56, is formed under the bottom face of the trench isolation region 56 down to the position deeper than the n-type diffusion layer 58. Accordingly, it is possible to shield a leakage current between pixels, to facilitate inter-pixel isolation and to reduce color mixture, whereby an imaging characteristic can be enhanced.

Moreover, since the element-isolating diffusion layer 57 is also formed on the sidewalls of the trench isolation region 56, a depletion layer generated in the photodiode is arranged not to approach the trench isolation region 56 (i.e. not to reach a defect or a damage area generated in a substrate region (an activated region SDG) in the vicinity of the trench isolation region 56 upon formation thereof. Accordingly, it is possible to reduce a leakage current between pixels attributed to the defect and the damage.

As a result, it is possible to reduce white spots, dark noises, color mixture and the like in the CMOS image sensor, whereby an imaging characteristic thereof can be enhanced.

Figure 4:
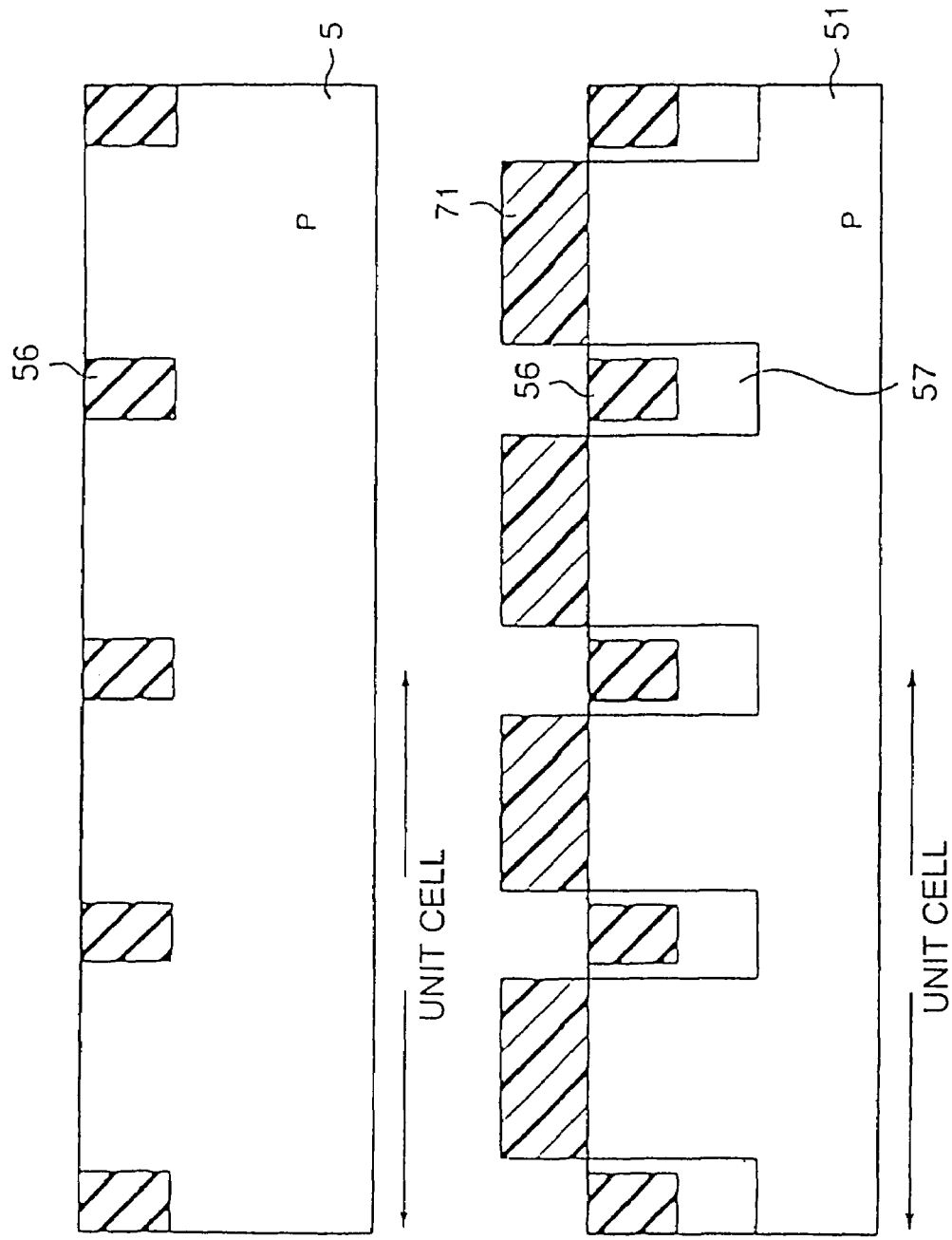
FIGS. 4A and 4B are cross-sectional views showing a fabricating process of the CMOS image sensor of FIG. 3.

FIGS. 4A and 4B are cross-sectional views showing a fabricating process for the CMOS image sensor of FIG. 3.

First, the trench isolation regions 56 are formed in desired positions on the silicon substrate 51. Next, mask members 71 are provided on the silicon substrate 51 in desired positions while evading positions corresponding to projected regions for forming the element-isolating diffusion layers inclusive of upper faces of the trench isolation regions 56, thus forming the element-isolating diffusion layers 57. Thereafter, the respective gate electrodes 59 to 62, the diffusion layers 58 of the photodiodes, diffusion layers to constitute sources and drains of respective transistors, line layers 63 and 64, the light-shielding film 65, the interlayer film 66, the condenser lenses 67 and the like are formed.

Figure 5:
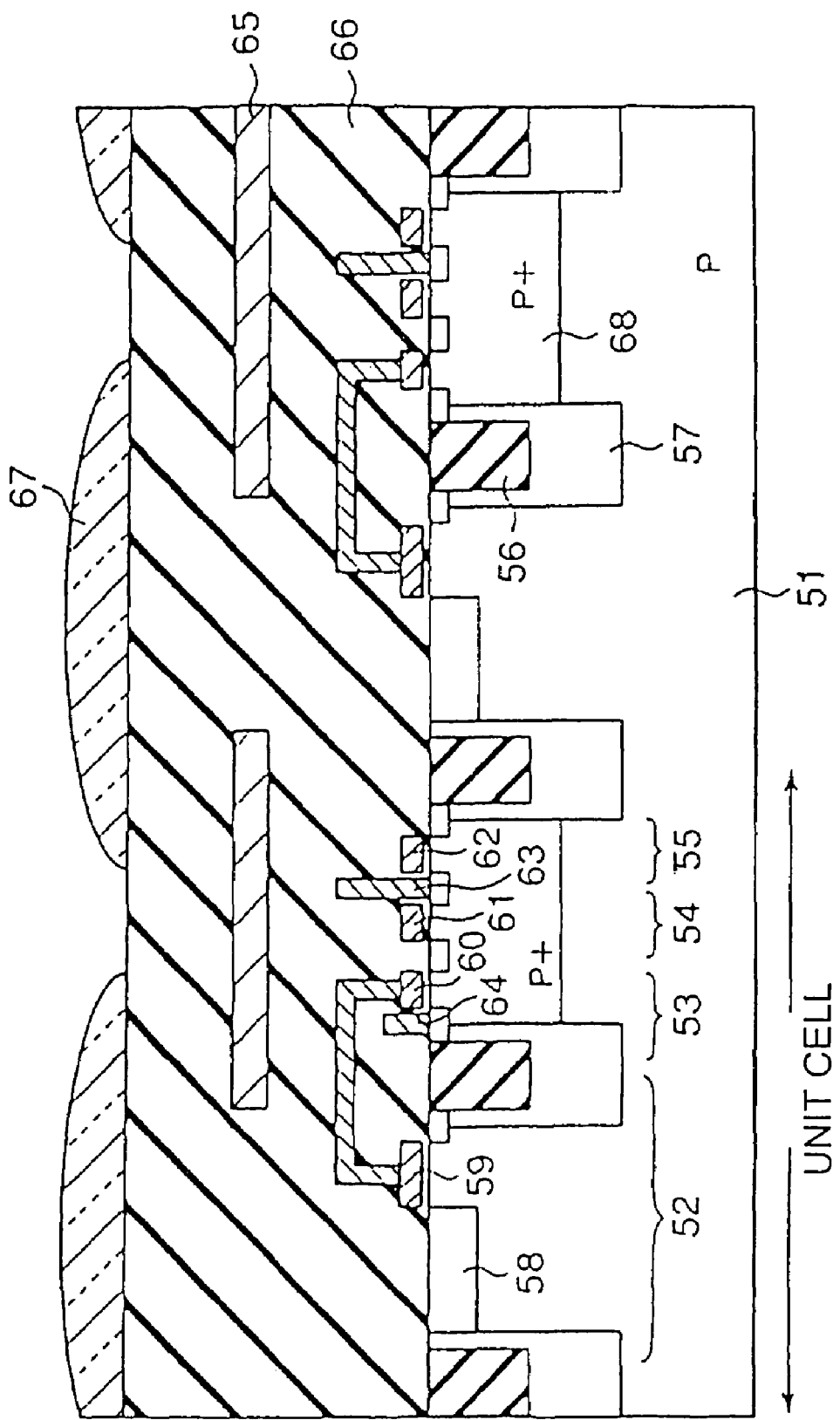
FIG. 5 is a cross-sectional view schematically showing a part of a CMOS image sensor according to embodiment of the present invention.

In FIG. 5, a part of a CMOS image sensor according to a second embodiment of the present invention is extracted out and a cross-sectional structure thereof is schematically illustrated. As compared to the CMOS image sensor of the first embodiment previously described with reference to FIG. 3, the CMOS image sensor of the second embodiment has the equivalent circuit but differs in formation of a $p^+$-well region 68 of higher density than the silicon substrate 51 in a substrate region for the NMOS transistors of the scanning circuit unit. Since other factors of the CMOS image sensor of the second embodiment are the same as those in the first embodiment, the same reference numerals as those in FIG. 3 are attached to FIG. 5. In this case, the $p^+$-well region 68 requires density to satisfy a characteristic of the NMOS transistors in the scanning circuit unit. The $p^+$-well region 68 can be formed in one process simultaneously with a p-well region of NMOS transistors of an logic circuit which is formed on the same chip.

According to the above-described constitution, the CMOS image sensor can facilitate inter-pixel isolation and reduce color mixture as similar to the above-described CMOS image sensor of the first embodiment, whereby it is possible to reduce a leakage current attributable to a defect or a damage generated in a silicon substrate region around the trench. As a result, it is possible to reduce white spots and dark noises in the CMOS image sensor, whereby an imaging characteristic thereof can be enhanced.

Furthermore, since the $p^+$-well region 68 is present in the substrate region for the NMOS transistors of the scanning circuit unit, it is possible to miniaturize the transistors in the scanning circuit unit smaller than the photoelectric conversion unit 52.

Figure 6:
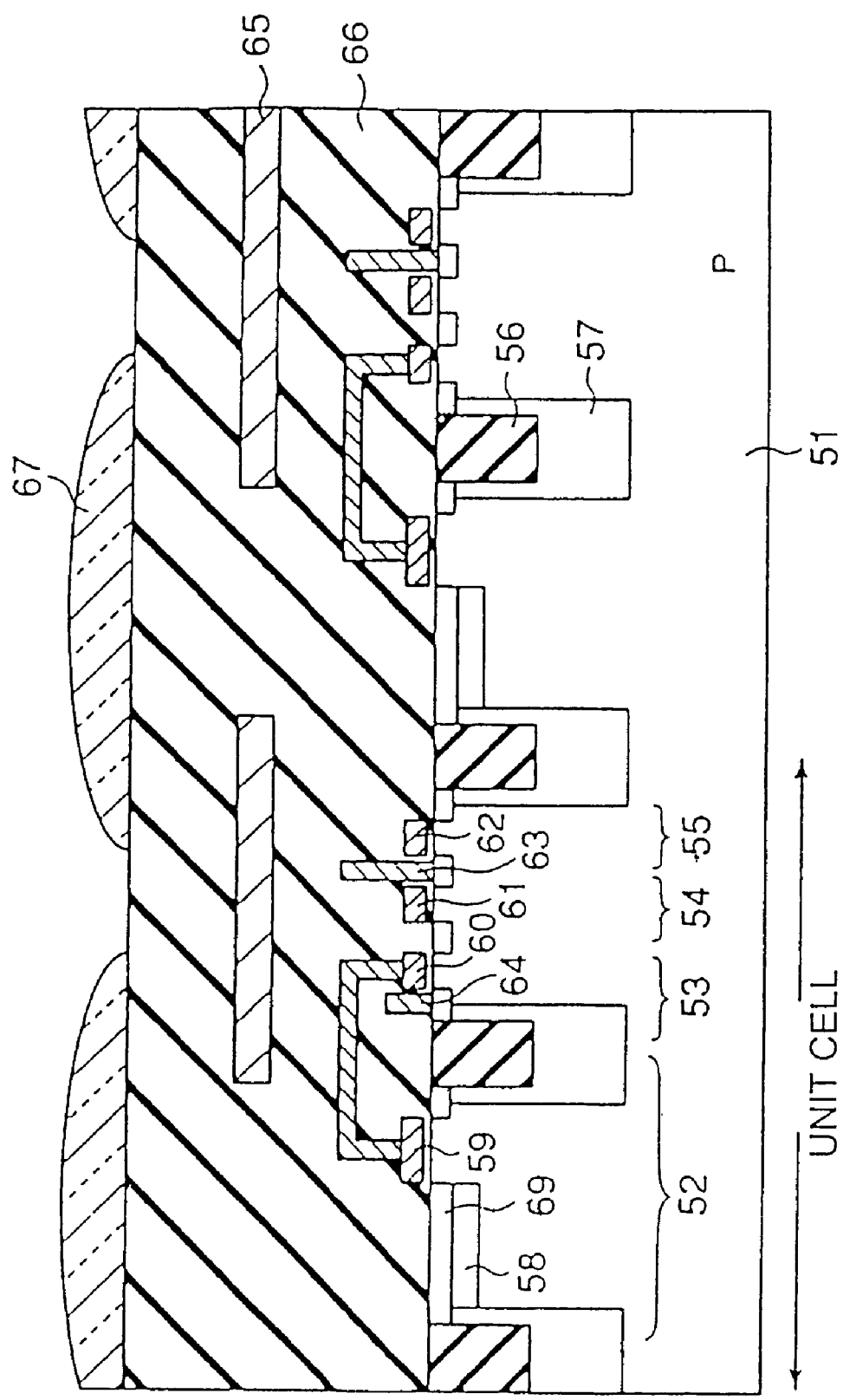
FIG. 6 is a cross-sectional view schematically showing a part of a CMOS image sensor according to embodiment of the present invention.

In FIG. 6, a part of a CMOS image sensor according to a third embodiment of the present invention is extracted out and a cross-sectional structure thereof is schematically illustrated. As compared to the CMOS image sensor of the first embodiment previously described with reference to FIG. 3, the CMOS image sensor of the third embodiment has the same equivalent circuit but differs in formation of a $p^+$-diffusion layer 69 of density equal to or higher than the element-isolating diffusion layer 57, on a surface (a silicon interface) of the diffusion layer 58 of the photodiode. Since other factors of the CMOS image sensor of the third embodiment are the same as those in the first embodiment, the same reference numerals as those in FIG. 3 are attached to FIG. 6.

According to the above-described constitution, the CMOS image sensor can shield the depletion layer of the photodiode not to approach a damaged layer generated on the interface of the silicon substrate upon formation of the diffusion layer 58, whereby it is possible to reduce a leakage current on the interface of the silicon substrate (a leakage current of the pixel). As a result, it is possible to reduce white spots, dark noises and the like in the CMOS image sensor, whereby an imaging characteristic thereof can be enhanced.

Figure 7:
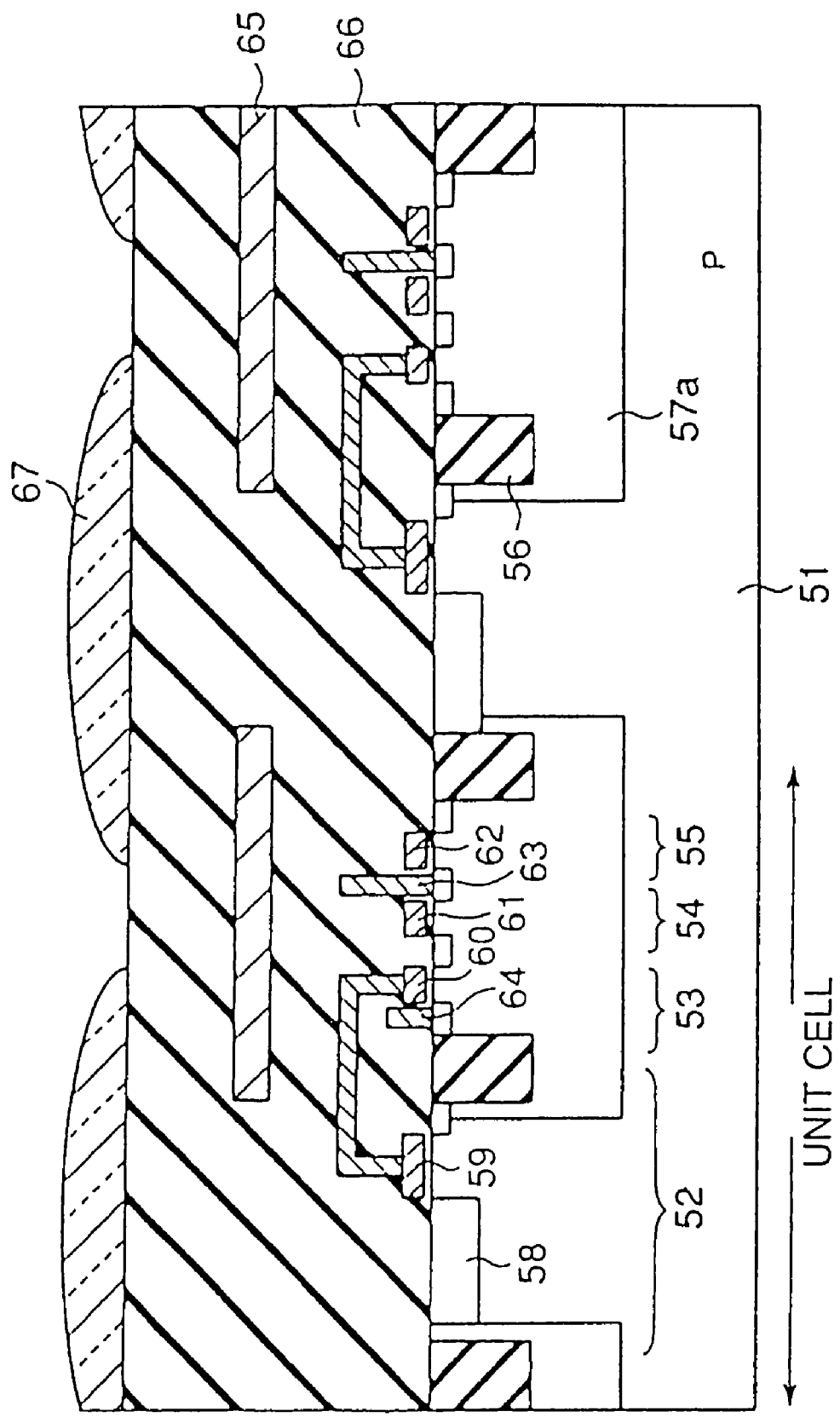
FIG. 7 is a cross-sectional view schematically showing a part of a CMOS image sensor according to embodiment of the present invention.

In FIG. 7, a part of a CMOS image sensor according to a fourth embodiment of the present invention is extracted out and a cross-sectional structure thereof is schematically illustrated. As compared to the CMOS image sensor of the second embodiment previously described with reference to FIG. 5, the CMOS image sensor of the fourth embodiment has the same equivalent circuit but differs in formation of the element-isolating diffusion layer 57 and the $p^+$-well region 68 for a scanning circuit unit simultaneously and integrally as an element-isolating diffusion layer 57a. Since other factors of the CMOS image sensor of the fourth embodiment are the same as those in the second embodiment, the same reference numerals as those in FIG. 5 are attached to FIG. 7.

According to the above-described constitution, the CMOS image sensor can further strengthen inter-pixel isolation in comparison with the above-described CMOS image sensor of the first embodiment, whereby it is possible to further reduce color mixture and to reduce a leakage current attributable to a defect or a damage generated in a silicon substrate region around the trench. As a result, it is possible to reduce white spots and dark noises in the CMOS image sensor, whereby an imaging characteristic such as color mixture can be further enhanced.

Furthermore, as similar to the above-described CMOS image sensor of the second embodiment, it is possible to miniaturize the scanning transistors, and thus miniaturizing the overall system.

In addition, since the element-isolating diffusion layer 57 and the $p^+$-well region 68 for a scanning circuit unit are simultaneously and integrally formed, it is possible to reduce steps in a fabricating process.

FIGS. 8A and 8B are cross-sectional views showing a fabricating process of the CMOS image sensor of FIG. 7.

First, trench isolation regions 56 are formed in desired positions on a silicon substrate 51. Subsequently, steps are carried out pursuant to the fabricating process for the CMOS image sensor of the first embodiment as described with reference to FIGS. 4A and 4B. Specifically, mask members 71a are provided on the silicon substrate 51 in desired positions while evading positions corresponding to projected regions for forming the element-isolating diffusion layers inclusive of upper faces of the trench isolation regions 56, thus forming the element-isolating diffusion layers 57a. Thereafter, respective gate electrodes 59 to 62, diffusion layers 58 of photodiodes, diffusion layers to constitute sources and drains of respective transistors, line layers 63 and 64, a light-shielding film 65, an interlayer film 66, condenser lenses 67 and the like are formed.

With respect to the CMOS image sensor according to the fourth embodiment, it is possible to form a $p^+$-diffusion layer (not shown) of density equal to or higher than the element-isolating diffusion layer 57a on a surface (a silicon interface) of the diffusion layer 58 of the photodiode, as similar to the third embodiment.

According to the above-described constitution, a similar effect to the third embodiment is obtained in addition to the above-described effect of the fourth embodiment. Specifically, the CMOS image sensor of the modified example can shield a depletion layer of the photodiode from a damaged layer generated on the interface of the silicon substrate upon formation of the diffusion layer 58, whereby it is possible to reduce a leakage current on the interface of the silicon substrate (a leakage current of the pixel). As a result, it is possible to reduce white spots, dark noises and the like in the CMOS image sensor, whereby an imaging characteristic thereof can be enhanced.

Figure 9:
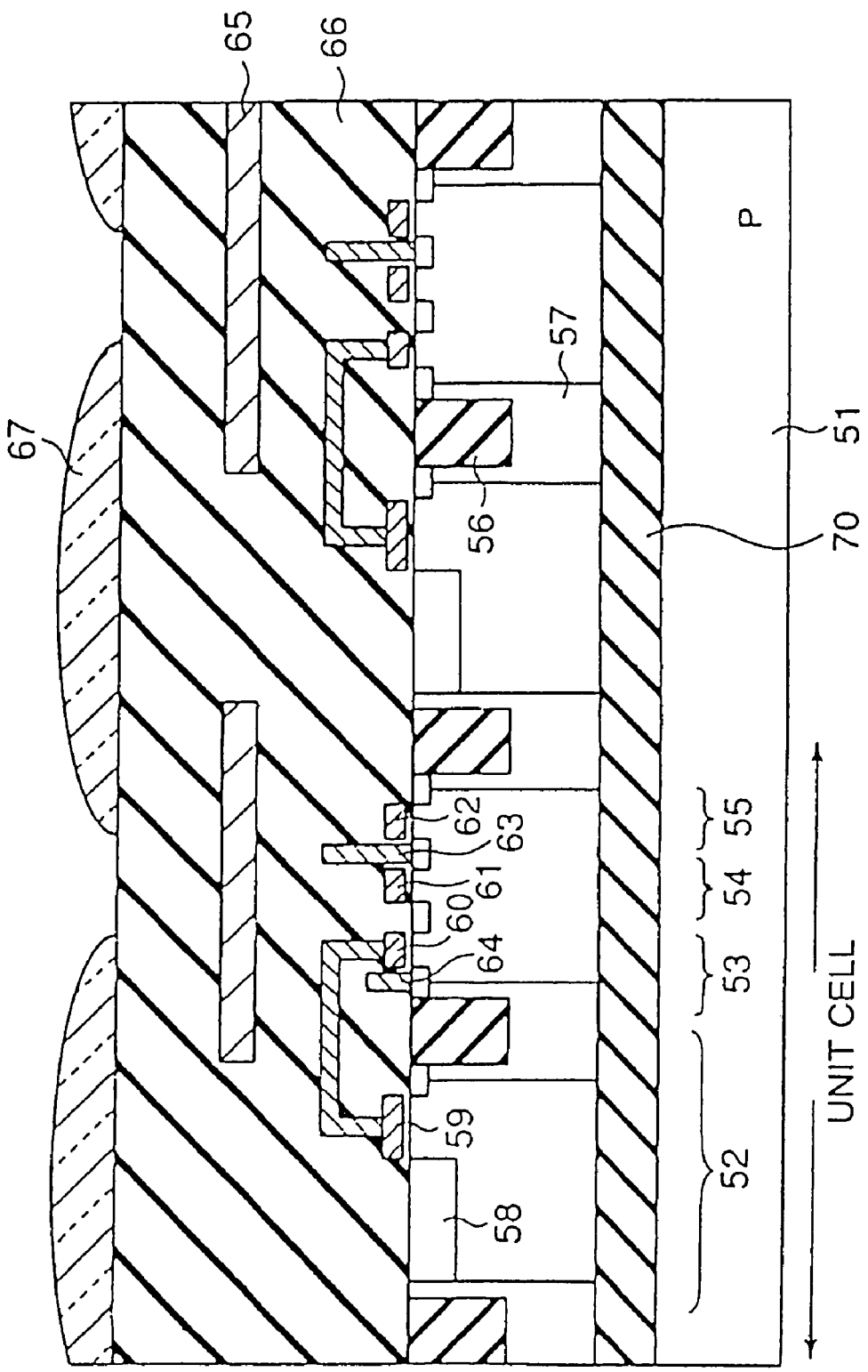
FIG. 9 is a cross-sectional view schematically showing a part of a CMOS image sensor according to a fifth embodiment of the present invention.

In FIG. 9, a part of a CMOS image sensor according to a fifth embodiment of the present invention is extracted and a cross-sectional structure thereof is schematically illustrated.

As compared to the above-described CMOS image sensor of the first embodiment, the CMOS image sensor of the fifth embodiment differs in that a p-type second element-isolating diffusion layer 70 of higher density than a silicon substrate 51 is provided so as to abut on bottom faces of element-isolating diffusion layers 57. Since other factors of the CMOS image sensor of the fifth embodiment are the same as those in the first embodiment, the same reference numerals as those in FIG. 3 are attached to FIG. 9.

According to the above-described constitution, the CMOS image sensor can prevent infusion of pixel signals for adjacent pixels or more distant pixels, and the CMOS image sensor can also reduce diffusion currents from the substrate 51, whereby it is possible to reduce a leakage current attributable to a defect or a damage generated in a silicon substrate region around a trench.

As a result, the CMOS image sensor can further strengthen inter-pixel isolation in comparison with the above-described CMOS image sensor of the first embodiment, whereby it is possible to further reduce color mixture or a noise attributable to the leakage current.

FIGS. 10A and 10B are cross-sectional views showing a fabricating process for the CMOS image sensor of FIG. 9.

First, the second element-isolating diffusion layer 70 is formed in a silicon substrate 51 in a horizontal direction so as to abut on bottom faces of projected regions for forming an after-mentioned plurality of first element-isolating diffusion layers 57. Subsequently, similar steps to the fabricating process for the CMOS image sensor of the first embodiment as described with reference to FIGS. 4A and 4B are carried out. Specifically, mask members 71 are provided on the silicon substrate 51 in desired positions while evading positions corresponding to the projected regions for forming the element-isolating diffusion layers 57 inclusive of upper faces of trench isolation regions 56, thus forming the element-isolating diffusion layers 57. Thereafter, respective gate electrodes 59 to 62, diffusion layers 58 of photodiodes, diffusion layers to constitute sources and drains of respective transistors, line layers 63 and 64, a light-shielding film 65, an interlayer film 66, condenser lenses 67 and the like are formed.

With respect to the CMOS image sensor according to the fifth embodiment, it is possible to form a p$^+$-diffusion layer (not shown) of density equal to or higher than the element-isolating diffusion layer 57 on a surface (a silicon interface) of the diffusion layer 58 of the photodiode, as similar to the third embodiment.

According to the above-described constitution, a similar effect to the third embodiment is obtained in addition to the above-described effect of the fifth embodiment.

With respect to the CMOS image sensor according to the fifth embodiment, it is possible to form the element-isolating diffusion layer 57 and a p$^+$-well region 68 for a scanning circuit unit simultaneously and integrally as an element-isolating diffusion layer 57a, as similar to the fourth embodiment.

According to the above-described constitution, a similar effect to the fourth embodiment is obtained in addition to the above-described effect of the fifth embodiment.

In each of the foregoing embodiments, description has been made regarding a CMOS image sensor as an example, in which one photodiode is disposed in each unit cell. However, the present invention is also applicable to a CMOS image sensor in which two photodiodes are disposed in each unit cell.

Moreover, without limitations to the CMOS sensors as described in the respective embodiments, the present invention is also applicable to CMOS line sensors.

As described above, according to a solid-state imaging device of the present invention, it is possible to isolate pixels sufficiently, to reduce color mixture and to reduce dark noises and white spots if a trench isolation structure is adopted thereto, whereby an imaging characteristic thereof can be enhanced.

What is claimed is:

1. A system for performing an operation utilizing a sensed image, the system comprising a solid-state imaging device, the device including:
    a plurality of unit cells on a semiconductor substrate of a first conductivity type, each unit cell including a photoelectric conversion unit comprising a photodiode having a diffusion layer of a second conductivity type;
    a trench isolation region for isolating the photoelectric conversion unit, the trench isolation region being formed in the semiconductor substrate; and
    a first element-isolating diffusion layer of the first conductivity type formed under a bottom face of the trench isolation region down to a position deeper than the diffusion layer of the photodiode from the surface of the semiconductor substrate.

2. The system according to claim 1, wherein the density of the first element-isolating diffusion layer is higher than that of the semiconductor substrate.

3. The system according to claim 1, wherein the first element-isolating diffusion layer is formed on a side of the trench isolation region.

4. The system according to claim 3, wherein the first element-isolating diffusion layer comprises means for preventing depletion layer, which is generated in the photodiode, from approaching the trench isolation region.

5. A system for performing an operation utilizing a sensed image, the system comprising a solid-state imaging device, the device including:
    a plurality of unit cells on a semiconductor substrate of a first conductivity type, each unit cell including a photoelectric conversion unit comprising a photodiode having a diffusion layer of a second conductivity type and a signal scanning circuit unit;
    a trench isolation region for isolating the photoelectric conversion unit from the signal scanning circuit unit; and
    an element-isolating diffusion layer of the first conductivity type formed in the semiconductor substrate, the trench isolation region and the signal scanning circuit being formed in the element-isolating diffusion layer.

6. The system according to claim 5, wherein the density of the element-isolating diffusion layer is higher than that of the semiconductor substrate.

7. The system according to claim 5, wherein the element-isolating diffusion layer of the first conductivity type includes more than one of the trench isolation regions.

8. A system for performing an operation utilizing a sensed image, the system comprising a solid-state imaging device, the device including:
    a plurality of unit cells on a semiconductor substrate of a first conductivity type, each unit cell including a photoelectric conversion unit comprising a photodiode having a diffusion layer of a second conductivity type;
    a trench isolation region for isolating the photoelectric conversion unit, the trench isolation region being formed in the semiconductor substrate;
    a first element-isolating diffusion layer of the first conductivity type formed under a bottom face of the trench isolation region down to a position deeper than the diffusion layer of the photodiode from the surface of the semiconductor substrate; and
    a second element-insulating diffusion layer formed in the semiconductor substrate continuously under the first element-isolating diffusion layer.

9. The system according to claim 8, wherein the density of the first element-isolating diffusion layer is higher than that of the semiconductor substrate.

10. A system for performing an operation utilizing a sensed image, the system comprising a semiconductor device, the device including:
    a plurality of unit cells on a semiconductor substrate of a first conductivity type, each unit cell including a photoelectric conversion unit comprising a photodiode having a diffusion layer of a second conductivity type;
    a trench isolation region for isolating the photoelectric conversion unit, the trench isolation region being formed in the semiconductor substrate;
    a first element-isolating diffusion layer of the first conductivity type formed under a bottom face of the trench isolation region down to a position deeper than the diffusion layer of the photodiode from the surface of the semiconductor substrate; and
    a logic circuit including MOS transistor and a trench region on the semiconductor substrate.

11. The system according to claim 10, wherein the trench isolation region and the trench region are formed in the same process.

12. The system according to claim 10, wherein the density of the first element-isolating diffusion layer is higher than that of the semiconductor substrate.

13. The system according to claim 10, wherein the first element-isolating diffusion layer is formed on a side of the trench isolation region.

14. The system according to claim 10, wherein the first element-isolating diffusion layer comprises means for preventing a depletion layer, which is generated in the photodiode, from approaching the trench isolation region.

15. A system for performing an operation utilizing a sensed image, the system comprising a semiconductor device, the device including:
   a lens;
   a plurality of unit cells on a semiconductor substrate of a first conductivity type, each unit cell including a photoelectric conversion unit which converts an optical signal incident on the lens to an electrical signal comprising a photodiode having a diffusion layer of a second conductivity type;
   a trench isolation region for isolating the photoelectric conversion unit, the trench isolation region being formed in the semiconductor substrate;
   a first element-isolating diffusion layer of the first conductivity type formed under a bottom face of the trench isolation region down to a position deeper than the diffusion layer of the photodiode from the surface of the semiconductor substrate; and
   a logic circuit including MOS transistor and a trench region on the semiconductor substrate.

16. The system according to claim 15, wherein the density of the first element-isolating diffusion layer is higher than that of the semiconductor substrate.

17. The system according to claim 15, wherein the first element-isolating diffusion layer is formed on a side of the trench isolation region.

18. The system according to claim 15, wherein the first element-isolating diffusion layer comprises means for preventing a depletion layer, which is generated in the photodiode, from approaching the trench isolation region.

19. A method of making a system for performing an operation utilizing a sensed image, the system comprising a semiconductor device, the method including:
   making a plurality of unit cells on a semiconductor substrate of a first conductivity type, each unit cell including a photoelectric conversion unit comprising a photodiode having a diffusion layer of a second conductivity type;
   making a trench isolation region for isolating the photoelectric conversion unit, the trench isolation region being formed in the semiconductor substrate;
   making a first element-isolating diffusion layer of the first conductivity type formed under a bottom face of the trench isolation region down to a position deeper than the diffusion layer of the photodiode from the surface of the semiconductor substrate;
   making a logic circuit including MOS transistor and a trench region on the semiconductor substrate.

20. The method according to claim 19, wherein the trench isolation region and the trench region are formed in the same process.

21. The method according to claim 19, wherein the density of the first element-isolating diffusion layer is higher than that of the semiconductor substrate.

22. The method according to claim 19, wherein the first element-isolating diffusion layer is formed on a side of the trench isolation region.

* * * * *